(12) United States Patent
Moreau et al.

(10) Patent No.: US 10,777,513 B2
(45) Date of Patent: Sep. 15, 2020

(54) INTEGRATED CIRCUIT COMPRISING A CHIP FORMED BY A HIGH-VOLTAGE TRANSISTOR AND COMPRISING A CHIP FORMED BY A LOW-VOLTAGE TRANSISTOR

(71) Applicant: Exagan, Grenoble (FR)

(72) Inventors: Eric Moreau, Frouzins (FR); Thierry Sutto, Seysses (FR); Laurent Guillot, Seysses (FR)

(73) Assignee: Exagan, Grenoble (FR)

( * ) Notice: Subject to any disclaimer, the term of this patent is extended or adjusted under 35 U.S.C. 154(b) by 0 days.

(21) Appl. No.: 16/304,643

(22) PCT Filed: May 26, 2017

(86) PCT No.: PCT/FR2017/051315
§ 371 (c)(1),
(2) Date: Nov. 26, 2018

(87) PCT Pub. No.: WO2017/203186
PCT Pub. Date: Nov. 30, 2017

(65) Prior Publication Data
US 2019/0279948 A1  Sep. 12, 2019

(30) Foreign Application Priority Data

May 26, 2016 (FR) ...................... 16 54715
Jul. 8, 2016 (FR) ...................... 16 56572

(51) Int. Cl.
*H01L 23/60* (2006.01)
*H03K 17/10* (2006.01)
(Continued)

(52) U.S. Cl.
CPC .......... *H01L 23/60* (2013.01); *H01L 21/8236* (2013.01); *H01L 23/043* (2013.01);
(Continued)

(58) Field of Classification Search
CPC ...................... H01L 21/8236; H01L 27/0883
(Continued)

(56) References Cited

U.S. PATENT DOCUMENTS 8,624,662 B2   1/2014 Parikh et al.
9,177,957 B1 * 11/2015 Lee .................. H01L 23/49589
(Continued)

FOREIGN PATENT DOCUMENTS

DE   102012101127 A1   8/2013
EP      2955844 A1   12/2015

OTHER PUBLICATIONS

Wen et al., A Dual-Mode Driver IC with Monolithic Negative Drive-Voltage Capability and Digital Current-Mode Controller for Depletion-Mode GaN HEMT, IEEE Transactions on Power Electronics, vol. 32, No. 1, (Jan. 2016), abstract only.
(Continued)

*Primary Examiner* — David Vu
*Assistant Examiner* — Brandon C Fox
(74) *Attorney, Agent, or Firm* — TraskBritt

(57) ABSTRACT

An integrated circuit comprises a housing, a plurality of connection pins, a first chip that includes a high-voltage depletion mode transistor, and a second chip that includes a low-voltage enhancement mode transistor. The first chip and second chip each comprise a gate bump contact, a drain bump contact and a source bump contact. The source bump contact of the high-voltage transistor is electrically connected to the drain bump contact of the low-voltage transistor so as to form a central node of the circuit. The circuit includes at least one first Kelvin pin that is electrically connected to the source bump contact of the low-voltage transistor.

19 Claims, 7 Drawing Sheets

(51) Int. Cl.
- *H01L 23/00* (2006.01)
- *H01L 23/043* (2006.01)
- *H01L 23/495* (2006.01)
- *H03F 1/22* (2006.01)
- *H03F 3/195* (2006.01)
- *H01L 25/18* (2006.01)
- *H03K 17/082* (2006.01)
- *H01L 21/8236* (2006.01)
- *H01L 27/088* (2006.01)
- *H01L 25/07* (2006.01)
- *H03K 17/687* (2006.01)
- *H01L 23/62* (2006.01)
- *H01L 25/16* (2006.01)

(52) U.S. Cl.
CPC .... *H01L 23/4952* (2013.01); *H01L 23/49562* (2013.01); *H01L 23/49568* (2013.01); *H01L 23/49575* (2013.01); *H01L 24/49* (2013.01); *H01L 25/18* (2013.01); *H01L 27/0883* (2013.01); *H03F 1/223* (2013.01); *H03F 3/195* (2013.01); *H03K 17/0822* (2013.01); *H03K 17/102* (2013.01); *H01L 23/62* (2013.01); *H01L 25/072* (2013.01); *H01L 25/16* (2013.01); *H01L 2224/05553* (2013.01); *H01L 2224/05554* (2013.01); *H01L 2224/48091* (2013.01); *H01L 2224/48137* (2013.01); *H01L 2224/48247* (2013.01); *H01L 2224/48257* (2013.01); *H01L 2224/49113* (2013.01); *H01L 2224/73265* (2013.01); *H01L 2924/13091* (2013.01); *H01L 2924/19107* (2013.01); *H03K 2017/6875* (2013.01)

(58) Field of Classification Search
USPC .......................................... 257/675; 327/434
See application file for complete search history.

(56) References Cited

U.S. PATENT DOCUMENTS

| | | |
|---|---|---|
| 9,268,512 B2 | 2/2016 | Shimazaki et al. |
| 9,761,703 B1* | 9/2017 | Hsu ..................... H01L 23/4824 |
| 2011/0193619 A1* | 8/2011 | Parikh ................. H01L 21/8258 327/534 |
| 2014/0167822 A1 | 6/2014 | Rugger et al. |
| 2014/0175454 A1* | 6/2014 | Roberts ................... H01L 25/18 257/76 |
| 2014/0377911 A1 | 12/2014 | Wu |
| 2015/0041984 A1* | 2/2015 | Otremba ........... H01L 23/49524 257/773 |
| 2016/0006428 A1* | 1/2016 | Wang ................... H03K 17/102 327/109 |
| 2016/0086878 A1* | 3/2016 | Otremba ........... H01L 23/49575 257/139 |

OTHER PUBLICATIONS

International Search Report for International Application No. PCT/FR2017/051315, dated Sep. 28, 2017, 3 pages.
International Written Opinion for International Application No. PCT/FR2017/051315, dated Sep. 28, 2017, 9 pages.

\* cited by examiner

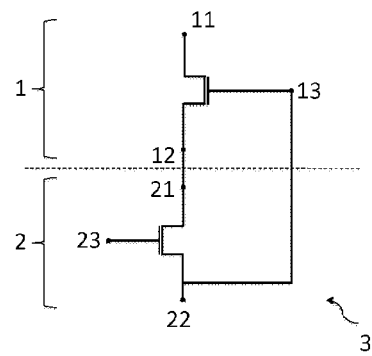
FIG.1a – I State of the art
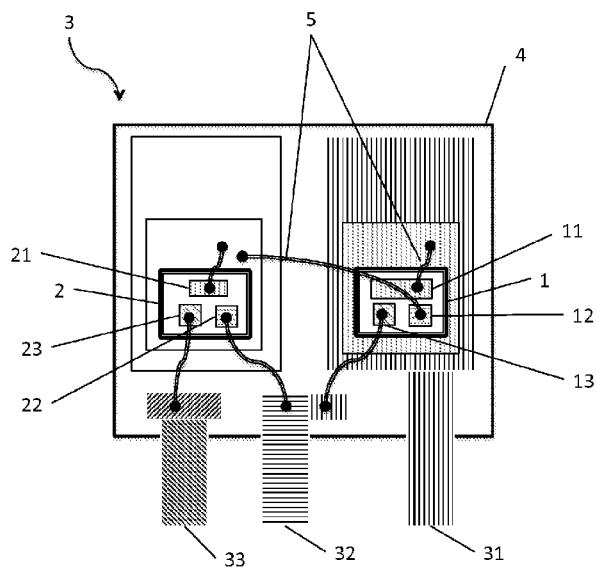
FIG.1b – I State of the art

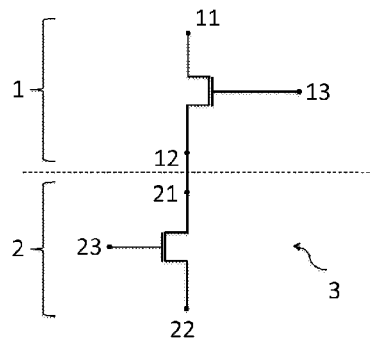
FIG.1c – State of the art
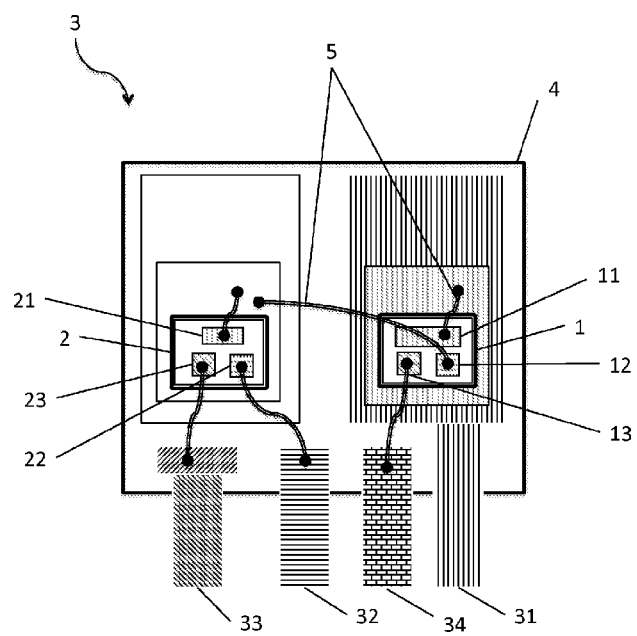
FIG.1d – State of the art

INTEGRATED CIRCUIT COMPRISING A CHIP FORMED BY A HIGH-VOLTAGE TRANSISTOR AND COMPRISING A CHIP FORMED BY A LOW-VOLTAGE TRANSISTOR

CROSS-REFERENCE TO RELATED APPLICATIONS

This application is a national phase entry under 35 U.S.C. § 371 of International Patent Application PCT/FR2017/051315, filed May 26, 2017, designating the United States of America and published in International Patent Publication WO 2017/203186 A1 on Nov. 30, 2017, which claims the benefit under Article 8 of the Patent Cooperation Treaty to French Patent Application Serial No. 1654715, filed May 26, 2016, and to French Patent Application Serial No. 1656572, filed Jul. 8, 2016.

TECHNICAL FIELD

The present disclosure relates to an integrated circuit comprising a chip formed by a high-voltage transistor and comprising a chip formed by a low-voltage transistor.

BACKGROUND

HEMT transistors (High Electron Mobility Transistors) made of III-N semiconductor materials are conventionally "normally on," i.e., they have a negative threshold voltage and can conduct current with a voltage between the gate and the source of 0V. These components with negative threshold voltages are called depletion mode (or "D-Mode") components.

It is preferable for power electronics applications to have so-called "normally off" components, i.e., to have a positive threshold voltage that, therefore, cannot conduct current when the gate voltage is 0V. These components are currently called enhancement mode ("E-mode") components.

Manufacturing such high-voltage components on III-N E-mode semiconductor materials proved to be complex and these components often have lower intrinsic performances than similar D-mode components.

An alternative to a simple high-voltage E-mode component is to combine a high-voltage D-mode component, such as a D-mode HEMT transistor made of III-N semiconductor materials, with a low-voltage E-mode component, such as an E-Mode MOSFET (Metal Oxide Semiconductor Field Effect Transistor) made of silicon. Two chips 1, 2, respectively comprising the HEMT and MOSFET components, are then associated to form a hybrid integrated circuit 3, for example, a switch integrated circuit.

FIG. 1a shows the block diagram of a hybrid, so-called "cascode," circuit associating HEMT and MOSFET components. An integrated circuit 3 implementing this first configuration is shown in FIG. 1b. The drain 21 and the source 22 of an E-mode MOSFET chip 2 are, respectively, connected to the source 12 and the gate 13 of a D-mode HEMT chip 1. This electrical connection is provided in the housing 4 of the integrated circuit 3 comprising two chips 1, 2, usually through a "wire bonding" 5 between the gate bump contacts 13, 23, the source bump contacts 12, 22 and the drain bump contacts 11, 21 accessible on each of the chips 1, 2. In the integrated cascode circuit 3, the gate 23 of the MOSFET chip 2 controls the setting of the ON mode or the OFF mode of the integrated circuit 3.

The gate bump contact 23 of the MOSFET chip 2 is connected in the housing 4 of the integrated circuit 3 to a gate pin 33. The source bump contact 22 of the MOSFET chip 2 is connected in the housing 4 to a source pin 32. Eventually, the drain bump contact of the HEMT chip 1 is connected, still in the housing 4, to a drain pin 31. The three pins 31, 32, 33 provide the electrical connections of the integrated circuit 3 outside the housing 4.

FIG. 1c shows the block diagram of a so-called "dual" hybrid circuit associating HEMT and MOSFET components. An integrated circuit 3 implementing this second configuration is shown in FIG. 1d. According to this alternative configuration, the chips 1, 2, respectively comprising the HEMT and MOSFET components, are simply connected in series, with the drain 21 of the E-mode MOSFET chip 2 being connected to the source 12 of the D-mode HEMT chip 1. In this configuration, the housing 4 of the integrated circuit 3 has an additional gate pin 34 electrically connected to the gate bump contact 13 of the D-mode HEMT chip 1 so as to enable the direct control of this transistor.

For a more detailed discussion of the operating principles of a "cascode" circuit or a "dual" circuit, reference can be made to the document "A Dual-Mode Driver IC with Monolithic Negative Drive-Voltage Capability and Digital Current-Mode Controller for Depletion-Mode GaN HEMT," by Yue Wen et al., IEEE Transactions on Power Electronics, Issue 99, 1996.

Whatever the chosen configuration, the integrated circuit 3 is intended to be positioned on a printed circuit board to be interconnected with other components.

As is well known per se, for instance, from documents U.S. Pat. Nos. 92,683,512 or 8,624,662, it is customary to include additional components, such as resistors or capacitances, in the integrated circuit 3 to form a protective device. This protection device aims at controlling, especially during the switching transient phases, the voltage (or current) that may flow (or circulate) in some nodes of the hybrid circuit.

The nature of the protective device may depend on the considered application (for instance, the considered switching frequency, or the amplitude of the voltage to be switched, etc.), or on the nature of the other components that the integrated circuit 3 can be connected with on the PCB.

Integrated circuits of the prior art implementing a hybrid circuit do not make it possible to adjust the protection device configuration previously planned by the manufacturer.

Besides, having an integrated circuit comprising a high-voltage E-mode component and a low-voltage D-mode component, which could be used, as needed, in a "cascode" configuration or in a "dual" configuration, might be desirable.

More generally, today, no integrated circuit exists for applications in the field of power switching, comprising an high-voltage E-mode component and a low-voltage D-mode component, with a versatile, simple and robust composition, i.e., which can be used in a wide range of applications (with highly variable switching currents, voltages and frequencies) and (specifically thermal or electromagnetic) environments without changing the internal architecture thereof.

BRIEF SUMMARY

The present disclosure aims to solve all or part of the aforementioned drawbacks.

In order to reach one of these aims, the object of the disclosure is to provide an integrated circuit comprising a housing and a plurality of connection pins, with a first chip that includes a high-voltage depletion mode transistor, and a second chip that includes a low-voltage enhancement mode transistor, with the first chip and second chip each comprising gate bump contacts, drain bump contacts and source bump contacts; with the source bump contact of the high-voltage transistor being electrically connected to the drain bump contact of the low-voltage transistor so as to form a central node of the circuit.

The integrated circuit comprises a first Kelvin pin electrically connected to the source bump contact of the low-voltage transistor.

According to other advantageous and non-exhaustive characteristics of the disclosure, considered individually or along with any technically feasible combination:
- the integrated circuit further comprises a drain pin electrically connected to the drain bump contact of the high-voltage transistor; a source pin electrically connected to the source bump contact of the low-voltage transistor; a gate pin electrically connected to the gate bump contact of the low-voltage transistor;
- the integrated circuit further comprises one central point pin electrically connected to the central node of the circuit;
- the first Kelvin pin is adjacent to the gate pin or to the central point pin;
- the integrated circuit further comprises a second Kelvin pin electrically connected to the source bump contact of the low-voltage transistor;
- the first Kelvin pin is adjacent to the gate pin or positioned on the same side of the housing as the gate pin;
- the second Kelvin pin is adjacent to the central point pin or positioned on the same side of the housing as the central point pin;
- the central point pin is adjacent to the source pin;
- the source bump contact of the low-voltage transistor is electrically connected to the gate bump contact of the high-voltage transistor;
- the integrated circuit comprises a second Kelvin pin electrically connected to the gate bump contact of the high-voltage transistor;
- the second gate pin is adjacent to the central point pin;
- the electrical connections consist of wire bondings;
- the integrated circuit comprises a resistive passive component positioned in the housing and electrically connected between the gate bump contact of the second chip and the source bump contact of the second chip;
- the resistive passive component is formed in a third chip electrically connected to the second chip through wire bonding;
- the resistive passive component is formed in the second chip or in the first chip;
- the resistive passive component has a resistance between 100 kilo-ohms and 1 mega-ohm;
- the integrated circuit includes a plurality of first chips, which each comprise a high-voltage transistor and are connected in parallel with each other;
- the integrated circuit comprises a plurality of drain pins, with each drain pin being electrically connected to a drain bump contact of a first chip of the plurality of first chips.

BRIEF DESCRIPTION OF THE DRAWINGS

Further characteristics and advantages of the disclosure will be clear from the detailed description of the disclosure, made in reference to the accompanying figures, among which:

FIGS. 1a and 1b, respectively, show a block diagram and an integrated circuit of a cascode circuit of the prior art;

FIGS. 1c and 1d, respectively, show a block diagram and an integrated circuit of a "dual" circuit of the prior art;

DETAILED DESCRIPTION

The figures are for illustrative purposes only, and do not show the elements to scale. Moreover, the same reference may be used for identical elements or elements performing the same functions in the various embodiments of the disclosure or in the prior art.

Figure 2A:
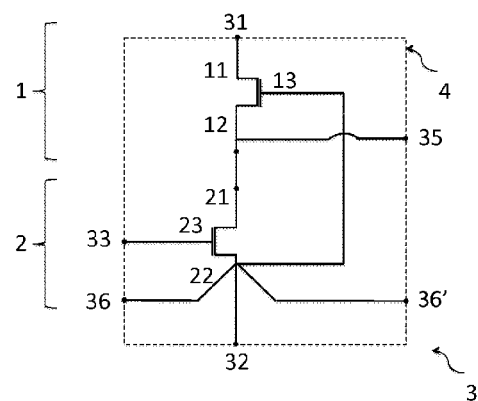
FIGS. 2a and 2b, respectively, show a first block diagram and a first integrated circuit according to this disclosure.

FIG. 2a shows a block diagram of an integrated circuit 3 according to the disclosure. Inside a housing 4, shown in dotted lines in FIG. 2a, a high-voltage depletion mode transistor 1 (which will be referred to as a "high-voltage transistor" in the following description) and a low-voltage enhancement mode transistor 2 (which will be referred to as a "low-voltage transistor" in the following description) are connected to each other in a cascode configuration. More specifically, the source 12 of the high-voltage transistor 1 is electrically connected to the drain 21 of the low-voltage transistor 2. This connection defines a central node of the circuit. The gate 13 of the high-voltage transistor 1 is electrically connected to the source 22 of the low-voltage transistor 2.

A plurality of nodes of the circuit is made accessible from outside the housing 4 by means of pins in order to electrically connect this circuit to other circuits.

"Pin" in the following description, will refer to any element of the integrated circuit 3 emerging from the housing 4 and giving electrical access to one of the nodes of the integrated circuit 3. It may be a conductive member projecting from the housing 4 or a simple contact surface positioned on one side of the housing 4.

As shown in the block diagram of FIG. 2a, the integrated circuit 3 comprises a gate pin 33 and a source pin 32, which are respectively electrically connected to the gate 23 and the source 22 of the low-voltage transistor 2. This circuit also includes a drain pin 31 electrically connected to the drain 11 of the high-voltage transistor 1 and a central point pin 35 giving electrical access to the central node of the integrated circuit 3.

The integrated circuit 3 of FIG. 2a may be used as a power switch. To this end, the source pin 32 is connected to an electrical ground, the drain pin 31 is connected to a load. The switching of the integrated circuit 3 is controlled by a control signal applied to the gate pin 33. When the control signal has a zero voltage, the integrated circuit 3 is in the OFF mode. When the control signal has a positive voltage (typically a few volts), the integrated circuit 3 is in the ON mode. Several amperes can then circulate between the drain pin 31 and the source pin 32 of the integrated circuit 3.

As previously mentioned in the introduction of this application, the switching of the integrated circuit 3 between an ON state and an OFF state (or vice versa between an OFF state and an ON state) may generate uncontrolled currents or voltages in the circuit, particularly in the central node. These voltages or these transient currents can damage the high-voltage and low-voltage transistors 1, 2 if they exceed predefined thresholds.

In order to obviate such phenomena, the device of the present disclosure makes it possible to position, outside the housing 4, a counter-measure circuit between the central point pin 35 and the source pin 32. It may, for example, be a circuit comprising a resistor, possibly supplemented with a parallel capacitance, positioned between the above-mentioned pins 35, 32. The counter-measure circuit more particularly makes it possible to limit the transient voltage developing in the central node, and to derive the excessive static or transient current that may be circulating in the low-voltage transistor 2 during the switching phases.

When the switching frequency of the control signal is high, for example, above 100 kHz, the electrical connections of the internal circuit (for instance, the electrical connections connecting the electrodes of the high- and low-voltage transistors 1, 2 to the pins of the housing 4) may have an inductive behavior. The sudden changes of the current flowing in these connections lead to the generation of a significant transient voltage across the terminals thereof. This is particularly true for the link connecting the source 22 of the low-voltage transistor 2 and the source pin 32 of the circuit. In order to avoid injecting such transient currents and voltages to the control circuit side, which can be connected to the gate pin 33 and source pin 32, or to the counter-measure circuit side, which can be connected to the central point pin 35 and the source pin 32, the circuit provides a first Kelvin pin 36 electrically connected to the source 22 of the low-voltage transistor 2 by a Kelvin connection.

As is well known per se, a Kelvin connection, or voltage sensing connection is intended to be connected to a circuit having a very high steady-state impedance, so that the current flowing through this connection is extremely low. A measure of the voltage at the source 22 of the low-voltage transistor 2 is thus available at the Kelvin pin 36 of the housing 4. As the current flowing in the link connecting the source 22 to the Kelvin pin 36 is very low, the voltage measurement is not affected by inductive voltages.

The Kelvin pin 36 may be connected to a control circuit outside the housing, with the control circuit itself being connected to the gate pin 33. Alternatively or additionally, the Kelvin pin 36 may be connected to the counter-measure circuit outside the housing, with the counter-measure circuit itself being connected to the central point pin 35. The joint availability of the central point voltage at the central point pin 35 and the Kelvin pin 36, makes it possible to form a counter-measure device very suitable for the environment that the integrated circuit 3 is placed in.

In order to enable an easy mounting of the integrated circuit 3 on a PCB, facilitate the configuration or the routing of conductor tracks on the circuit and minimize the control loops, it can be chosen to have, on the housing 4, the first Kelvin pin 36 adjacent to the gate pin 33 or positioned on the same side of the housing as the gate pin 33 (as shown in FIG. 2a), or adjacent to the central point pin 35 or positioned on the same side of the housing as the central point pin 35.

The integrated circuit 3 can advantageously be provided with a first Kelvin pin 36 and a second Kelvin pin 36', having similar constitutions. In this case, the first Kelvin pin 36 may be positioned on the housing 4, adjacent to the gate pin 33 (or positioned on the same side of the housing as the gate pin 33) and the second Kelvin pin 36' adjacent to the central point pin 35 (or positioned on the same side of the housing as the central point pin 35).

Figure 2B:
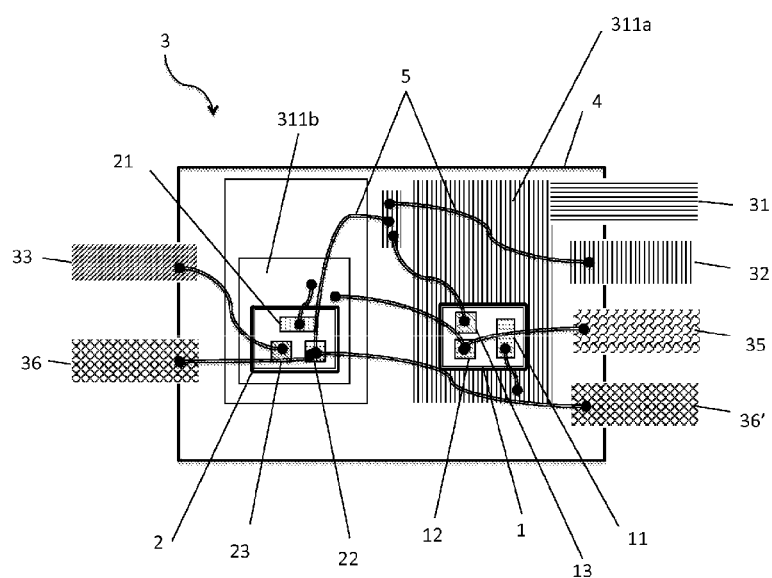

FIG. 2b shows one embodiment, in the form of an integrated circuit 3, of the schematic circuit shown in FIG. 2a.

The integrated circuit 3 comprises a housing 4, a first chip 1 comprising a high-voltage depletion mode transistor and a second chip 2 comprising a low-voltage enhancement mode transistor. The first and second chips 1, 2, respectively, include gate bump contacts 13, 23, drain bump contacts 11, 21 and source bump contacts 12, 22. Advantageously, the high-voltage transistor is a HEMT transistor made of III-N semiconductor materials and the low-voltage transistor is a MOSFET (Metal Oxide Semiconductor Field Effect Transistor) made of silicon.

The drain bump contacts 11, 21 of the first chip 1 and the second chip 2 are respectively connected to contact plates 311a, 311b or through wire bonding (as shown in FIG. 2b), or through a vertical connection having a drain contact at the rear face of the first and/or second chip 1, 2 in contact with the contact plates 311a, 311b.

The contact plate 311b forms an electrical terminal that the contact terminal of the source 12 of the first chip 1 is electrically connected to, and is the central point of the integrated circuit 3. The contact plate 311b is electrically connected to the central point pin 35 of the integrated circuit 3. The second contact plate 311a is in turn electrically connected to (or forms) the drain pin 31 of the integrated circuit 3.

The gate bump contact 13 of the first chip 1 is connected to the source bump contact 22 of the second chip 2. A cascode circuit is thus formed. These bump contacts 13, 22 are in turn connected to the source pin 32.

The gate pin 33 of the integrated circuit 3 is connected to the gate bump contact 23 of the second chip 2.

Optionally, the housing 4 of the integrated circuit 3 may comprise a first Kelvin pin 36 and a second Kelvin pin 36'. The first Kelvin pin 36, and when present the second Kelvin pin 36', is electrically connected to the source bump contact 22 of the low-voltage transistor formed on the second chip 2.

As seen above, the first Kelvin pin 36 may be positioned on the housing 4, adjacent to, or on the same side of the housing 4, as the gate pin 33 or as the central point pin 35. When two Kelvin pins 36, 36' are provided, one can be positioned adjacent to the gate pin 33 (or on the same side of the housing 4 as this pin) and the other one can be adjacent to the central point pin 35 (or on the same side of the housing 4 as this pin).

Besides, the central point pin 35 may be positioned adjacent to the source pin 32 to facilitate the laying of the counter-measure circuit on the printed circuit.

As shown in FIG. 2b, the electrical connections or links consist of (or include) wire bondings 5. Although not shown in the figures, such links or electrical connections may also include passive elements, such as resistors or diodes, which may, for example, be integrated into one of the first and second chips 1, 2 or on an additional chip positioned in the housing.

The housing 4 may also include additional circuits integrated into one of the chips 1 or 2, or into the additional chip. This may be, for example, a control circuit of the gate.

Figure 4A:
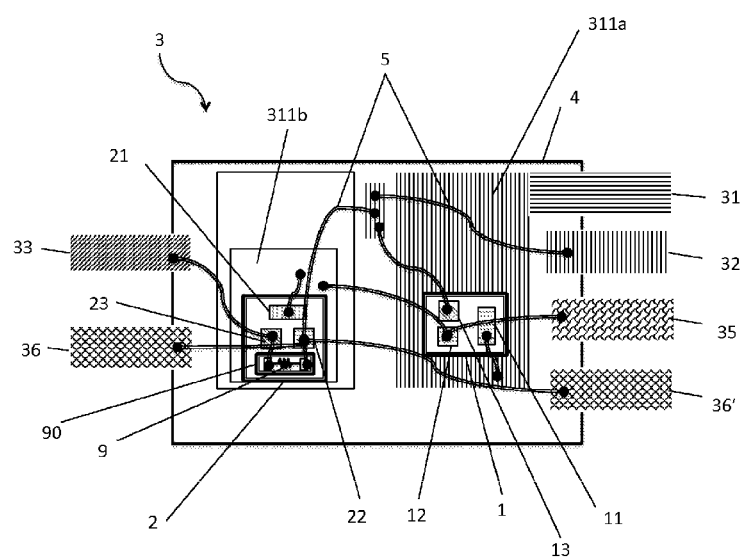
FIGS. 4a to 4c show different embodiments of an integrated circuit according to the disclosure having a protective resistive passive component.
Figure 4B:
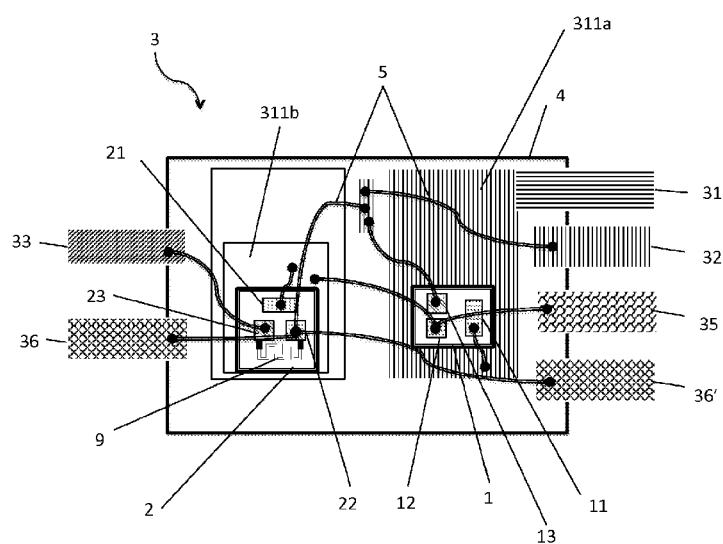
Figure 4C:
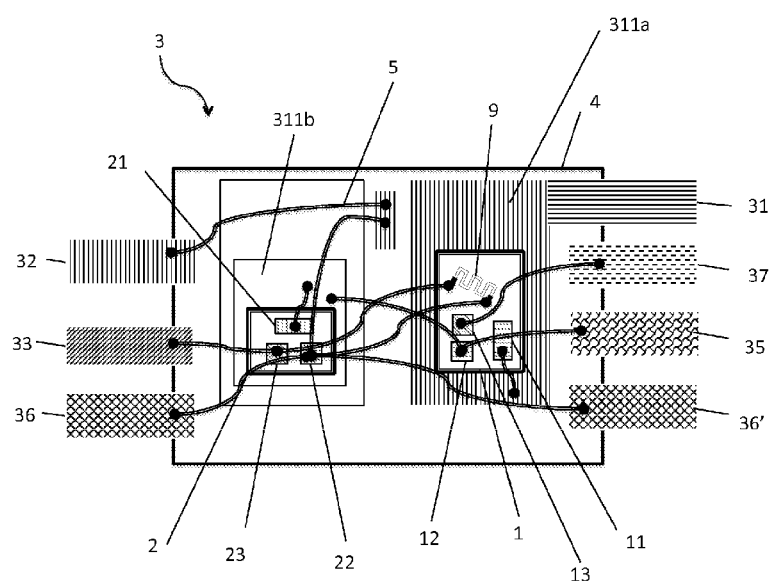

Thus, the integrated circuit 3 can be provided with a resistive passive component 9 (as shown in FIGS. 4a-4c) positioned in the housing 4 and electrically connected between the gate bump contact 23 of the low-voltage transistor (also called second gate bump contact 23) and the source bump contact 22 of the low-voltage transistor (also called second source bump contact 22).

Potential failures of the gate connection that would result in a floating potential thereof and a loss of control of the integrated circuit functioning as a high-power switch are thus contained. The presence of the resistive passive component 9, as close to the second chip 2 as possible, the gate 23 of which controls the ON or OFF mode of the integrated circuit 3, makes it possible to bring the potential of the gate 23, if it is floating, back to the source potential (i.e., to a potential close to 0) and so to switch to the OFF mode if there is loss of control of the gate potential. Malfunctions occurring at the circuit board (cleavage of a PCB track, for example) are contained, as well as those that occur between the integrated circuit 3 and the printed circuit (detachment of a pin, for example). A particularly robust and secure circuit capable of containing failures to meet the set operational safety standards is thus formed.

FIG. 4a shows a first embodiment of an integrated circuit 3 comprising a resistive passive component 9 positioned in the housing 4 and electrically connected between the second gate bump contact 23 and the second source bump contact 22. The resistive passive component 9 is formed in a third chip 90 electrically connected to the second chip 2 through a wire bonding 5. Two wire bondings are added as compared to the conventional configuration for connecting, on the one hand, the second gate bump contact 23 (of the second chip 2), to a bump contact of the third chip 90 and, on the other hand, the second source bump contact 22 (of the second chip 2) to another bump contact of the third chip 90.

FIG. 4b shows a second embodiment of an integrated circuit 3 comprising a resistive passive component 9 integrated in the second chip 2. This configuration is very advantageous in that it does not add complexity to the assembling of the integrated circuit 3 since no additional wire bonding is required. The resistive passive component 9 can be produced during the development of the low-voltage transistor included in the second chip 2, in semiconductor technology, at the substrate (at the "wafer level") prior to any singulation of the chip 2. The connection of the resistive passive component 9 between the second gate bump contact 23 and the source bump contact 22 can thus be made in the metal interconnections layer, at the substrate. The resistive passive component 9 can, for example, consist of a metallic coil, the ends of which are connected to the bump contacts 23 and 22, respectively.

FIG. 4c shows a third embodiment of an integrated circuit 3 comprising a resistive passive component 9 integrated in the first chip 1. Two wire bondings 5 are added as compared to the conventional configuration for connecting, on the one hand, the second gate bump contact 23 (of the second chip 2), to a bump contact of the resistive passive component 9 of the first chip 1 and, on the other hand, the second source bump contact 22 (of the second chip 2) to another bump contact of the resistive passive component 9.

When the first chip 1 is based on III-N materials, the high-voltage transistor operating with a conduction channel formed in a two-dimensional electron gas layer (2DEG Layer), the resistive passive component 9 may advantageously be formed by a segment of the 2DEG layer connected, at its two ends, to bump contacts.

In all these embodiments, the resistive passive component 9 advantageously has a resistance above 100 kilo-ohms. This high resistance value is required to limit the leakage current between the gate and the source, in the ON mode of the integrated circuit 3. When considering a potential difference of the order of 10 volts between the gate and the source, the leakage current is estimated at 100 micro-amp, which is acceptable, in particular, for high-power switching applications (650V-10 A).

The resistance value of the resistive passive component 9 is preferably chosen to be less than 1 mega-ohm, to preserve an acceptable reaction time in case of failure, in compliance with safety standards. As a matter of fact, the time required for switching to the OFF mode, i.e., the time the floating gate potential will take to return to the source potential is defined by the time constant t-RC. R is the resistance between the gate and the source, mainly constituted by the resistive passive component 9; C is the capacitance between the gate and the source. When considering that the capacitance C is of the order of 100 picofarad in a 30V MOSFET component and that the time constant is expected to be less than or equal to 100 microseconds, the resistance of the resistive passive component 9 must preferably remain lower than 1 mega-ohm.

Figure 3A:
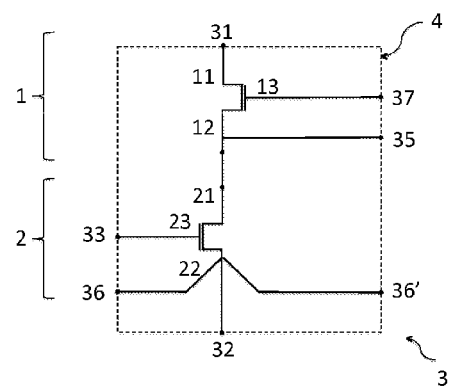
FIGS. 3a and 3b, respectively, show a second block diagram and a second integrated circuit according to the disclosure.

FIG. 3a shows another block diagram of an integrated circuit 3 according to the disclosure.

Unlike the block diagram of the integrated circuit 3 of FIG. 2a, the source 22 of the low-voltage transistor 2 is not electrically connected to the gate 13 of the high-voltage transistor 1 within the housing 4. The gate 13 of the high-voltage transistor 1 is however electrically connected to a second gate pin 37 of the housing 4.

The other elements of the integrated circuit 3 in this FIG. 3a are identical to those of the circuit of FIG. 2a, and the description thereof will thus be omitted in the interest of brevity.

The integrated circuit 3 of FIG. 3a can be used to form a cascode circuit. To this end, the source pin 32 simply has to be connected to the second gate pin 37, outside the housing 4, for example, via a conductive track of a printed circuit on which the integrated circuit 3 is positioned.

The integrated circuit 3 of FIG. 3a can also be used as a dual circuit. In this case, a first control circuit can be connected to the first gate pin 33, and a second control circuit (or an additional output of the first control circuit) connected to the second gate pin 37.

Advantageously, the control circuit associated with the second gate pin 37 is a differential control circuit connected, on the one hand, to the second gate pin 37 and, on the other hand, to the central point pin 35 of the integrated circuit 3. This configuration makes it possible to impose a differential voltage between the gate 13 and the source 12 of the high-voltage depletion mode transistor 1. A negative differential voltage makes it possible to switch this transistor to OFF, and thus to switch the integrated circuit 3 to OFF.

The control circuit associated with the first gate pin 33 then acts as a safety control making it possible to ensure the switching to OFF of the integrated circuit 3 during the power-ON or power-OFF phases of the integrated circuit 3 and peripheral circuits, during which the OFF state of the high-voltage transistor cannot be ensured.

Figure 3B:
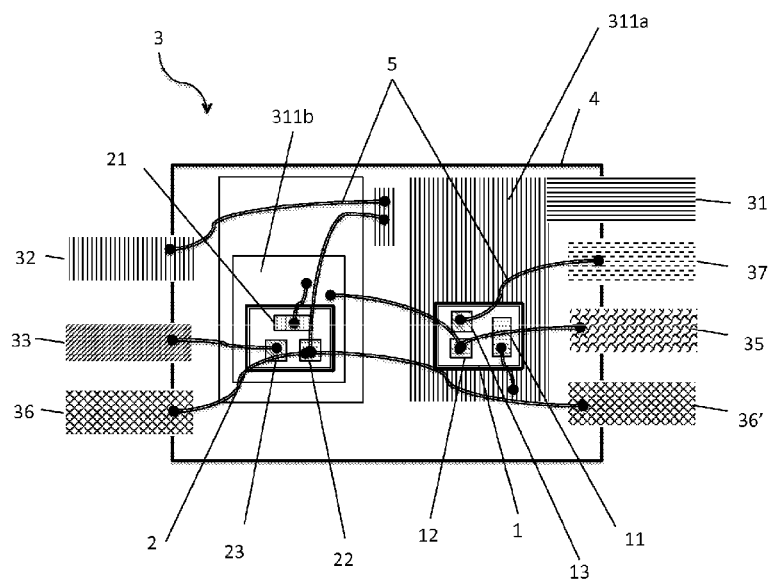

FIG. 3b shows one embodiment, in the form of an integrated circuit 3, of the schematic circuit shown in FIG. 3a.

The integrated circuit 3 has a second gate pin 37. The latter is electrically connected to the gate bump contact 13 of the high-voltage transistor of the first chip 1.

In the integrated circuit 3 of FIG. 3b, the gate bump contact 13 of the high-voltage transistor of the first chip 1 is not electrically connected within the housing to the source bump contact 22 of the second chip 2. The other elements and advantages of the integrated circuit 3 shown in FIG. 3b are identical to those of the integrated circuit of FIG. 2b, and the description thereof will thus be omitted in the interest of brevity.

Similarly to what was stated for the integrated circuit of FIG. 2b, the housing 4 can also comprise additional circuitry or components, such as a resistive passive component 9. These can be integrated into the first chip 1 or into the second chip 2, or be positioned on a complementary chip placed in the housing 4, as has been made explicit in the three detailed embodiments above.

Figure 5A:
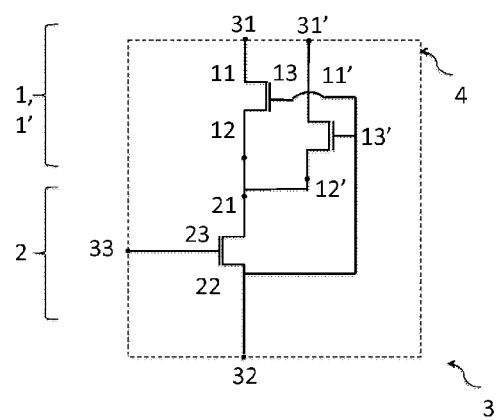
FIGS. 5a to 5c show an integrated circuit according to another aspect of the disclosure.

FIG. 5a shows a block diagram of another integrated circuit 3 according to a further aspect of the disclosure.

Inside a housing 4 shown in dotted lines in FIG. 5a, a low-voltage transistor 2 is connected, in a cascode configuration, with two high-voltage transistors 1, 1', which are, in turn, connected in parallel to each other. More specifically, the source 12, 12' of the high-voltage transistors 1, 1' are both electrically connected to the drain 21 of the low-voltage transistor 2. A central point of the circuit is thus defined, similarly to the configurations disclosed above. The gates 13, 13' of the high-voltage transistor 1, 1' are electrically connected to the source 22 of the low-voltage transistor 2.

This configuration can be generalized to more than two high-voltage transistors 1, 1', with these transistors being all placed in parallel to each other, with their sources being electrically connected to the drain bump contact 21 of the low-voltage transistor 2, and with their gates being electrically connected to the source 22 of the low-voltage transistor 2.

The high-voltage transistors 1, 1' have identical or similar threshold voltages Vt.

Quite surprisingly, the inventors of the present application have observed that even when the high-voltage transistors 1, 1' did not show exactly the same characteristics (which is very difficult to obtain since components, even from the same manufacturing batch, can still have very slight differences), the cascode configuration shown in FIG. 5a remains perfectly functional. However, the high-voltage transistors 1, 1' will preferably be so chosen that they have a threshold voltage Vt within a range of more or less 10% of their average threshold voltages.

This configuration helps to make the integrated circuit 3 versatile, i.e., it can be adapted to a wide range of applications. A selected number of high-voltage transistors 1, 1' of the integrated circuit 3 may, in particular, be connected on a printed circuit according to the expected intensity of the current in the application. If the current intensity is high, it may, for example, be decided to connect the two drains 11, 11' of the high-voltage transistors 1, 1' to the load, so as to distribute the current over both transistors. This leads to a very favorable thermal behavior of the integrated circuit 3, as compared to an integrated circuit wherein the whole of the current flows in a single high-voltage transistor. As a matter of fact, the temperature rise of the transistors 1, 1' is lower and specifically distributed over a larger surface area, which promotes, in two ways, the dissipation thereof.

The housing 4, according to this aspect of the disclosure, is advantageously provided with a plurality of drain pins 31, 31', electrically insulated from each other, with each drain pin being electrically connected to a drain 11, 11' of a high-voltage transistor 1, 1'. This pin configuration makes it possible to connect the integrated circuit 3 to the rest of the components of a printed circuit, in a circuit pattern wherein a selected number of high-voltage transistors 1, 1' can be used. This configuration also makes it possible to individually test the functionality of each of the high-voltage transistors 1, 1' of the integrated circuit upon completion of the manufacturing process, which would not be the case if a single drain pin 31 were electrically connected to the drains 11, 11' of the high-voltage transistors 1, 1'.

Advantageously, the first transistors 1, 1' comprise HEMT transistors made from III-N materials and the low-voltage transistor 2 is a MOSFET transistor made of silicon.

The integrated circuit 3 also comprises a gate pin 33, and a source pin 32 respectively connected to the gate 23 and source 22 of the high-voltage transistor 1.

The integrated circuit 3 is also fully compatible with all the characteristics of the integrated circuit 3 explained above in connection with FIGS. 2b, 3b and 4a-4c. Although not shown in FIG. 5a, a central point pin, a first and/or a second Kelvin pin making it possible to provide, outside the housing 4 a control or counter-measure circuit adapted to the particular application environments in which the integrated circuit 3 is employed, can be provided. To facilitate the achievement of these arrangements, the Kelvin pins can be respectively positioned so as to be adjacent to, or positioned on the same side of the housing as the gate pin 33; or adjacent to, or positioned on the same side of the housing as the central point pin when the latter is present.

It may also be provided to position other components, such as a resistive passive component, in the housing 4, as has been described above.

Similarly, rather than forming the cascode circuit directly inside the housing by connecting the source 22 of the low-voltage transistor 2 to the gates 13, 13' of the high-voltage transistors 1, 1', it may be preferred to electrically connect the gates 13, 13' to free pins of the housing 4 and thereby form a cascade circuit having a plurality of gate pins, which makes it possible to separately control the high-voltage and low-voltage transistors.

Figure 5B:
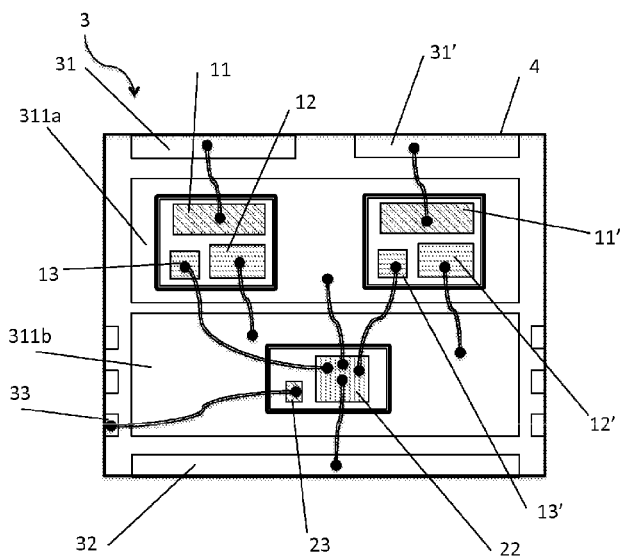
Figure 5C:
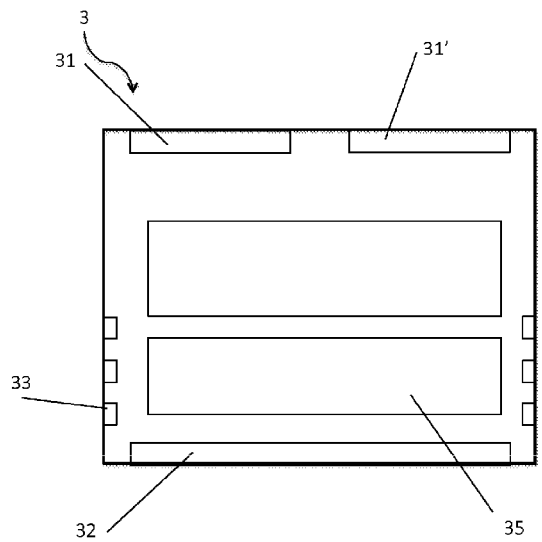

FIGS. 5b and 5c show a particular embodiment of the circuit shown in FIG. 5a.

Are provided, in a housing 4, a plurality of chips 1, 1' each comprising a high-voltage depletion mode transistor and a second chip 2 comprising a low-voltage enhancement mode transistor. The first chips 1, 1' and the second chip 2 respectively include gate bump contacts 13, 13', 23, drain bump contacts 11, 11', 21 and source bump contacts 12, 12', 22.

In FIG. 5b, the second drain bump contact 21 is positioned on the rear face of the second chip 2 and brought into electrical contact with a second contact plate 311b. As for the first chips 1, 1', they are positioned on a first contact plate 311a without the latter being connected to any bump contact of these first chips 1, 1'. The first contact plate 311a and the second contact plate 311b are electrically insulated from each other.

The first contact plate 311a can form an electrical ground of the integrated circuit. To this end, the second source bump contact 22 of the second chip 2 can be electrically connected to the contact plate 311a.

In the case of the integrated circuit 3 shown in FIG. 5b, the pins consist of a simple contact surface for a "surface" mounting of the integrated circuit 3 (or "Surface Mount Package"). These contact surfaces that form the pins may be provided on the rear face of the housing 4, along the sides of the face or on the central part thereof. It might of course also be considered to use another pinning technology.

The gate bump contacts 13, 13' of the first chips 1, 1' are connected to the source bump contact 22 of the second chip 2 so as to form a cascode circuit. The source bump contact 22 is in turn connected to the source pin 32, the gate pin 33 is connected to the second gate bump contact 23 of the second chip 2.

The second contact plate 311b is electrically connected to the source bump contacts 12, 12' of the first chips 1, 1' and the drain bump contacts 11, 11' of the first chips 1, 1' are electrically connected to the drain pins 31, 31' of the integrated circuit 3.

The electrical links and connections inside the housing 4 may consist of wire bondings. The housing 4 may be provided, on its rear face, with openings for exposing the first and second contact plates 311a, 311b so as to form additional pins in the form of central contact surfaces, as has been mentioned above.

FIG. 5c thus shows a view of the rear face of the integrated circuit 3. This view illustrates the gate pin 33, the source pin 32, and the drain pins 31, 31' of the integrated circuit 3 on the sides of the rear face of the housing 4. Central openings provided on the housing 4 expose the contact plates 311a, 311b, thus forming ground pins, and the central point pin 35 of the integrated circuit 3, respectively.

The pins of the integrated circuit 3 that are not used, can be used, for example, to form the connecting Kelvin pins, or to carry over the gate bump contacts 13, 13' of the high-voltage chips 1, 1' when it is preferred to configure the integrated circuit 3 as a cascade circuit.

The disclosure thus provides an integrated circuit 3 that may have a power switching function and that may have a central point pin 35 giving access to a central node of the circuit. It can be provided with Kelvin pins 36, 36' and include a plurality of first high-voltage chips, which makes it possible to manage the heating thereof at best. This integrated circuit 3 has the advantage of being very versatile, i.e., it can be combined with other (control or countermeasure) circuits for a wide range of applications, with the combination of these characteristics making it possible to configure these additional circuits according to the specifications (frequency, signal amplitude, transient phases, current intensity, etc.) of the application.

The invention claimed is:

1. An integrated circuit, comprising:
a housing;
a first chip that includes a high-voltage depletion mode transistor;
a second chip that includes a low-voltage enhancement mode transistor; the first chip and the second chip each comprising gate bump contacts, drain bump contacts and source bump contacts, the source bump contact of the high-voltage transistor being electrically connected to the drain bump contact of the low-voltage transistor so as to form a central node of the circuit; and
a plurality of connection pins including at least one first Kelvin pin that is electrically connected to the source bump contact of the low-voltage transistor, and a second Kelvin pin electrically connected to the source bump contact of the low-voltage transistor.

2. The integrated circuit of claim 1, wherein the plurality of connection pins further includes a central point pin electrically connected to the central node of the circuit.

3. The integrated circuit of claim 2, wherein the first Kelvin pin is adjacent to the central point pin or positioned on the same side of the housing as the central point pin.

4. The integrated circuit of claim 3, wherein the plurality of connection pins further includes a drain pin electrically connected to the drain bump contact of the high-voltage transistor; a source pin electrically connected to the source bump contact of the low-voltage transistor; and a gate pin electrically connected to the gate bump contact of the low-voltage transistor.

5. The integrated circuit of claim 3, wherein the source bump contact of the low-voltage transistor is electrically connected to the gate bump contact of the high-voltage transistor.

6. The integrated circuit of claim 2, wherein the plurality of connection pins further includes a drain pin electrically connected to the drain bump contact of the high-voltage transistor; a source pin electrically connected to the source bump contact of the low-voltage transistor; and a gate pin electrically connected to the gate bump contact of the low-voltage transistor.

7. The integrated circuit of claim 6, wherein the first Kelvin pin is adjacent to the gate pin or positioned on the same side of the housing as the gate pin.

8. The integrated circuit of claim 6, wherein the first Kelvin pin is adjacent to the gate pin or positioned on the same side of the housing as the gate pin and the second Kelvin pin is adjacent to the central point pin or positioned on the same side of the housing as the central point pin.

9. The integrated circuit of claim 6, wherein the central point pin is adjacent to the source pin.

10. The integrated circuit of claim 6, further comprising a second gate pin electrically connected to the gate bump contact of the high-voltage transistor.

11. The integrated circuit of claim 10, wherein the second gate pin is adjacent to the central point pin.

12. The integrated circuit of claim 1, wherein the source bump contact of the low-voltage transistor is electrically connected to the gate bump contact of the high-voltage transistor.

13. The integrated circuit of claim 1, wherein at least one electrical connection of the integrated circuit comprises a wire bonding.

14. The integrated circuit of claim 1, further comprising a resistive passive component positioned in the housing and electrically connected between the gate bump contact of the second chip and the source bump contact of the second chip.

15. The integrated circuit of claim 14, wherein the resistive passive component is formed in a third chip electrically connected to the second chip through wire bonding.

16. The integrated circuit of claim 14, wherein the resistive passive component is formed in the second chip or in the first chip.

17. The integrated circuit of claim 14, wherein the resistive passive component has a resistance between 100 kilo-ohms and 1 mega-ohm.

18. The integrated circuit of claim 1, further comprising a plurality of first chips, each first chip of the plurality of first chips comprising a high-voltage transistor, the first chips of the plurality being connected in parallel with each other.

19. The integrated circuit of claim 18, further comprising a plurality of drain pins, each drain pin being electrically connected to a drain bump contact of a first chip of the plurality of first chips.

* * * * *